United States Patent [19]

Jung et al.

[11] 4,015,992

[45] Apr. 5, 1977

[54] PROCESS FOR ACTIVATING A NON-CONDUCTIVE SUBSTRATE AND COMPOSITION THEREFOR

[75] Inventors: Horst Jung, Bielefeld; Karl-Wilhelm Sassenroth, Heepen; Nikolaus Ferenczy, Altenhagen, all of Germany

[73] Assignee: Dr. Hesse & Cie. Spezialfabrik fur Galvanotechnik, Bielefeld-Heepen, Germany

[22] Filed: Nov. 19, 1973

[21] Appl. No.: 416,812

[30] Foreign Application Priority Data

Nov. 23, 1972 Germany ........................... 2257378

[52] U.S. Cl. .................................... 106/1; 106/214
[51] Int. Cl.$^2$ ......................................... C23C 3/02
[58] Field of Search ................................. 106/1, 204

[56] References Cited

FOREIGN PATENTS OR APPLICATIONS 1,209,347  10/1970  United Kingdom ................... 106/1

OTHER PUBLICATIONS

Chem. Abst. 69; 92338S, 1968.

*Primary Examiner*—Theodore Morris
*Attorney, Agent, or Firm*—Browdy and Neimark

[57] ABSTRACT

A process for activating a substrate for metallization, which comprises treating the substrate at a pH of from 1.5 to 4.5 with an aqueous composition which is the reaction product obtained by reducing a solution of a salt of a metal of the palladium or platinum group or of gold with an excess of a polysaccharide, and/or a derivative thereof, having at least one reactive aldehyde group.

3 Claims, No Drawings

PROCESS FOR ACTIVATING A NON-CONDUCTIVE SUBSTRATE AND COMPOSITION THEREFOR

Field of the Invention

The present invention relates to coating and, more particularly, to the activation of substrates prior to metallization in a metallization bath. The substrates are typically composed of a non-conductive plastic material or ceramic and, optionally, partly of a conductive metal coating, and are principally employed in the production of printed circuit boards or the like.

Background

Metallization processes for non-conductive substances and for printed circuit boards are well known. However, they all have the disadvantage that pretreatment is very complicated, lengthy, and liable to failure. The so-called "electroless" coating processes known hitherto have recommended, for example, the following main treatment stages:
1. Degreasing.
2. Rinsing.
3. Deoxidization in an ammonium persulfate solution.
4. Rinsing.
5. Pickling.
6. Rinsing.
7. Catalysis, for example in a hydrochloric acid solution containing tin and palladium.
8. Rinsing.
9. Acceleration in an alkaline or acid-containing solution.
10. Rinsing.
11. Chemical copper plating.

Some publications, such as for example German Patent Specification No. 1,197,720, mention that acceleration is employed only selectively. It has, however, been found that in practice acceleration is always necessary. One difficulty consists in that the chemical copper bath used for metallization decomposes very quickly, or that precipitation in the copper bath commences too late and incompletely. Moreover, the adhesivity values between the copper backing and the chemically deposited copper coating are very poor.

Another process prescribes the same method, but treatment with a 10% hydrochloric acid solution, lasting for 10 – 20 minutes, is recommended for the acceleration (see German DAS 1,446,224).

A third process attempts to solve the problem by passing the workpieces which are to be metallized through the following stages of treatment:
1. Degreasing.
2. Rinsing.
3. Deoxidization.
4. Rinsing.
5. Immersion in a sensitizing solution which contains tin II chloride and a low-alkylated thiourea in addition to free hydrochloric acid.
6. Rinsing.
7. Activation in a palladium chloride solution containing free hydrochloric acid.
8. Rinsing.
9. Chemical copper plating (see German DAS 1,796,225).

Reference has been made above only to the very latest literature; with regard to the activation of non-conductive substances further publications exist, which however, all describe approximately the same large number of complicated pretreatment stages, while in addition the danger exists that during operation the above mentioned disadvantages occur of rapid decomposition of the copper bath and of belated, incomplete deposition of copper.

SUMMARY

It is, accordingly, an object of the present invention to overcome the deficiencies of the prior art, such as indicated above.

It is another object to provide for improved "electroless" coating.

It is another object to provide improved metallic coatings on non-conductive substrates, and to provide an improved process for achieving such coatings.

Another object of the invention is to provide an operationally reliable process of activation for metallization utilizing an activator bath, which is not only very stable to storage but is also very stable during operation, and which in addition enables the number of pretreatment stages before the metallization to be reduced, if desired.

According to the invention there is provided a process for activating a substrate for metallization, which comprises treating the substrate at a pH of from 1.5 to 4.5 with an aqueous composition which is the reaction product obtained by reducing a solution of a salt of a metal of the palladium or platinum group or of gold with an excess of a polysaccharide, and/or a derivative thereof, having at least one reactive aldehyde group.

The process of the invention has the particular advantage that the use of an additional reducing agent, which might frequently lead to disturbances, is not necessary. The use according to the invention of the activation solution consisting of a metal of the platinum or palladium group or gold together with a polysaccharide and/or the above described derivative thereof provides, as already mentioned, the additional advantage that operationally reliable working is possible because the activation bath is used is not only stable to storage as such, but is also stable during use and thus can be used for a long time for production purposes. The bath need not be discarded, but may be strengthened so that it can be used for a longer period of time.

For the activation itself the normal temperatures employed in the art may be used, that is to say, typically temperatures from room temperature and up to about 70°C. As is usual, working at higher temperatures provides the advantage that the actual activation proceeds more quickly. In addition, the evaporation which results concentrates the activation bath, so that when fresh solution is added for strengthening purposes the chances of the bath overflowing are reduced. Another unexpected advantage consists in that the treatment stages prior to metallization can be substantially shortened.

The following detailed description of specific embodiments will more fully reveal the nature and advantages of the instant invention, it being understood that such embodiments are offered illustratively.

Detailed Description

Using the process of the invention, the following stages of treatment may typically be employed:
A. Substrate: Copper-coated non-conductive material
 1. Degreasing.
 2. Rinsing.

3. Deoxidization, for example in an ammonium persulfate or copper chloride solution.
4. Rinsing.
5. Activation treatment using compositions in accordance with the present invention, e.g. as indicated in the following Examples.
6. Rinsing.
7. Chemical copper plating.

According to the above schedule, treatment is as follows:
1. Degreasing in an aqueous solution consisting of:
   50 g/l Trisodium Phosphate
   30 g/l Sodium metasilicate
   10 g/l Complex former f. i. Trilon B
   10 g/l Soda
   Dipping time: 5 minutes at 60° C, then rinsing
2. Slightly etching in a 15% Ammonium Persulfate Solution
   30° C, dipping time: one minute, then rinsing
3. Activation in an aqueous solution consisting of:
   1 g/l Palladium Sulfate
   40 g/l Dextrin
   10 g/l Borax
   Dipping time: 10 minutes at room temperature, then rinsing
4. Chemical copper-plating in a copper-reduction-bath of the following composition:
   35 g/l Copper sulfate
   50 g/l Sodium hydroxide
   20 g/l Sodium carbonate
   170 g/l Seignette's salt
   20 ml/l Versene T (mixture of disodium diaminotetraacetic acid and triethanolamine)
   150 ml/l Formaldehyde (about 35% aqueous solution)
   ph: 11.5
   temperature: 25° C
   dipping time: 45 minutes
   rinsing and drying
5. Application of circuit configuration: screen printing or by photographic means.

B. Substrate: ABS plastic or other plastic materials provided with a coating similar to ABS
1. Pickling in chromatosulfuric acid.
2. Detoxification.
3. Rinsing.
4. Activation using compositions in accordance with the present invention, e.g. as indicated in the following examples.
5. Rinsing.
6. Chemical copper plating or chemical nickel plating.

According to the above schedule the following treatment is done:
1. Pickling in an acid mixture consisting of:
   320 g/l Chromic acid
   480 g/l Sulphuric acid
   Residual amount of water
   Pickling time and temperature according to the substrate used
2. Detoxification in an aqueous solution consisting of:
   30 g/l Iron-II-sulfate
   90 g/l Sulphuric acid
3. Activation in an aqueous solution consisting of:
   0.5 g/l Platinum chloride
   20 g/l Dextrin
   ph: 3.0
   Temperature: 25° C
   Dipping time: 15 minutes
4. Chemical nickel plating in an aqueous solution consisting of
   26.7 g/l Nickel hypophosphite
   4.9 g/l Sodium acetate
   1.2 g/l Boric acid
   2.6 g/l Ammonium sulfate
   ph: 5.5. to 6.0
   Temperature: 20 to 25° C
   Dipping time: 10 minutes It should be understood that except for the activation stage, the means utilized for each of the other process stages may be in accordance with conventional practice, an advantage of the present invention being that fewer of such conventional process stages are necessary than has heretofore been possible. Also while two types of substrate are exemplified, it will be understood that the process may be carried out or adapted to the use of any other conventional non-conductive substrate.

The metallization process is therefore not only more reliable, because the activation bath contains no additional metal compounds, such as for example tin chloride, which could pass into the copper bath and there lead to uncontrollable precipitation of copper. The introduction of metal compounds can in fact reduce operational reliability and the life of the chemical metallization bath to a minimum. This results in continual disturbances to operation. Since, however, apart from platinum or palladium metals, no additional metal components are contained in the activation baths of the invention, such disturbances cannot occur in the metallization bath. The above list of typical treatment stages, however, also shows that some of the treatment stages required in previous processes can be eliminated, thus providing a further simplification of the metallization process.

In in comparison with known processes, in which hydrochloric acid solutions are used at a pH below 1, only a relatively low degree of acidity, namely a pH of from 1.5 to 4.5 is used in the present invention. Indeed, it is not essential to employ hydrochloric acid at all, and it is possible, for example, to employ sulfuric acid; this is advantageous since sulfuric acid provides a lesser problem with effluent. Sulfates can be eliminated more easily and the inert insoluble substances which are produced with sulfuric acid (for example calcium sulfate) can be removed with ease. It is, however, also a substantial advantage that no hydrochloric acid is evaporated into the ambient atmosphere, so that the air in the workroom is not polluted. Not only does this result in advantages in respect of work hygiene, but the corrosive action of hydrochloric acid vapors on equipment is also eliminated.

In a preferred embodiment of the invention, single-stage working may be adopted, that is to say the activated substrates can be passed directly to the reduction metallization bath without intermediate strengthening, after simple rinsing. Together with good stability during storage, amounting typically to more than one year, this constitutes a further advantage of the invention.

It is known that high-molecular organic substances, such as glue, albumen, carboxymethylcellulose, gum arabic, or certain polysaccharides, can serve as protective colloids for noble metal sols. The reduction of the noble metal salt to the metal or metal sol was, however, always previously effected with an additional reduction agent, such as for example hydrazine, sodium hypophosphite, or hydrogen in statu nascendi. It is therefore surprising that the reduction of the noble metal salt to the metal can be effected directly by means of the polysaccharide when the latter has at least one aldehyde group capable of effecting reduction, and that the reaction product constitutes a very stable activator bath. A preferred polysaccharide for this purpose is dextrin (e.g. yellow dextrin), but soluble starches, tragacanth, and the like may also be used, as well as mixtures thereof. It is also possible, for example, to use a polysaccharide derivative, such as a dextrin which has been reacted with an amine but which still contains at least one aldehyde group per molecule.

The activation agent is preferably produced by mixing together the components in a determined sequence. The polysaccharide solution is first brought to the desired pH between 1.5 and 4.5, preferably between 2 and 3. A buffer, such as borax or gluconate, may be added for this purpose in order to adjust and/or maintain the pH even when the noble metal salt is subsequently added. The noble metal salt, the salt of a metal of the platinum or palladium group or of the gold, is then added and thereupon the mixture is heated until the noble metal salt has been reduced to the metal. It is convenient to boil the mixture, and optionally to continue boiling for up to 10 minutes.

The following are preferred examples of activation baths according to the invention.

| Example 1 | |
|---|---|
| Palladium sulfate | approx. 0.1– 3 g/l |
| Sodium gluconate | approx. 10.0– 80 g/l |
| Starch | approx. 5.0–100 g/l |
| pH value of about 2 adjusted with sulfuric acid. | |
| Activation temperature: 45° C. | |
| Example 2 | |
| Palladium sulfate | approx. 0.1– 3 g/l |
| Tragacanth | approx. 5.0–80 g/l |
| pH value of about 2.8 adjusted with sulfuric acid | |
| Activation temperature: about 40° C. | |
| Example 3 | |
| Platinum sulfate | approx. 0.2– 4 g/l |
| Dextrin | approx. 10.0–100 g/l |
| Borax | approx. 5.0– 50 g/l |
| pH value of 3 adjusted with sulfuric acid. | |
| Activation temperature: about 40° C. | |
| Example 4 | |
| H (AuCl$_4$) | 0.1– 3.0 g/l |
| Dextrin | 5.0–50.0 g/l |
| Borax | 5.0–20.0 g/l |
| pH of 3.0 adjusted with HCl. | |
| Activation temperature: 20–25° C. | |
| Example 5 | |
| Pt Cl$_4$ | 0.1– 2.0 g/l |
| Dextrin | 5.0–40.0 g/l |
| Sodium Acetate | 10.0–40.0 g/l |
| pH of 2.5 adjusted with HCl. | |
| Example 6 | |
| Pt Cl$_4$ | 0.1– 2.0 g/l |
| Silicone | 5.0–40.0 g/l |
| Borax | 5.0–20.0 g/l |
| pH of 2.8 adjusted with HCl. | |
| Activation temperature: 20° C. | |
| Example 7 | |
| palladium sulfate | 0.4 g/l |
| Maltose | 40.0 g/l |
| pH of 2.5 to 3.8 adjusted with sulphuric acid | |
| Temperature: 20 to 40° C | |
| Example 8 | |
| palladium chloride | 0.5 g/l |
| Lactose | 12.0 g/l |
| Sodium gluconate | 20.0 g/l |
| pH of 2.5 to 3.8 adjusted with HCl | |
| Temperature: 20 to 40° C | |
| Example 9 | |
| Platinumchloride | 0.2 g/l |
| Gentiobiose amygdalose | 25.0 g/l |
| Borax | 10.0 g/l |
| pH of 2.2 to 3.8 adjusted with HCl | |
| Temperature: 20 to 40° C | |
| Example 10 | |
| palladium chloride | 0.3 g/l |
| Dextrin | 10.0 g/l |
| Glucose | 10.0 g/l |
| sodium gluconate | 20.0 g/l |
| pH of 2.2 to 3.5 adjusted with HCl | |
| Temperature: 20 to 60° C | |
| Example 11 | |
| palladium sulfate | 0.5 g/l |
| Maltose | 20.0 g/l |
| Soluble starch | 10.0 g/l |
| pH of 2.5 to 4.0 adjusted with sulphuric acid | |
| Temperature: 20 to 30° C | |

It will be obvious to those skilled in the art that various changes may be made without departing from the scope of the invention and the invention is not to be considered limited to what is described in the specification.

What is claimed is:

1. An aqueous composition for activating a non-conductive substrate prior to metallization, consisting essentially of the reaction product obtained by reducing a solution of a salt of a metal of the palladium or platinum group or of gold with an excess of a polysaccharide, or a derivative thereof, capable of serving as a protective colloid for a noble metal sol and having at least one reactive aldehyde group, said composition having a pH of from 1.5 to 4.5.

2. The composition of claim 1 wherein said polysaccharide is dextrin.

3. The composition of claim 2 which additionally contains a buffer.

* * * * *